(12) United States Patent
Johnson

(10) Patent No.: US 6,477,061 B1
(45) Date of Patent: Nov. 5, 2002

(54) I/O PORT EMI SHIELD

(75) Inventor: Bryan L. Johnson, Chesterfield, MO (US)

(73) Assignee: Amesbury Group, Inc., Amesbury, MA (US)

( * ) Notice: Subject to any disclaimer, the term of this patent is extended or adjusted under 35 U.S.C. 154(b) by 0 days.

(21) Appl. No.: 09/646,655

(22) PCT Filed: Mar. 20, 1999

(86) PCT No.: PCT/US99/06389

§ 371 (c)(1),
(2), (4) Date: Dec. 7, 2000

(87) PCT Pub. No.: WO99/49712

PCT Pub. Date: Sep. 30, 1999

Related U.S. Application Data

(60) Provisional application No. 60/079,030, filed on Mar. 23, 1998.

(51) Int. Cl.[7] .................................................. H05K 9/00
(52) U.S. Cl. ..................... 361/818; 361/800; 361/818; 174/35 R; 174/35 GC; 174/35 MS
(58) Field of Search ................................ 361/800, 816, 361/815; 174/35 R, 35 GC, 35 MS; 206/719

(56) References Cited

U.S. PATENT DOCUMENTS

| | | | | |
|---|---|---|---|---|
| 4,857,668 A | | 8/1989 | Buonanno | 174/35 GC |
| 5,105,056 A | * | 4/1992 | Hoge, Jr. et al. | 174/35 GC |
| 5,180,884 A | * | 1/1993 | Aldissi | 174/36 |
| 5,202,536 A | * | 4/1993 | Buonanno | 174/35 GC |
| 5,597,979 A | * | 1/1997 | Courtney et al. | 174/35 R |
| 5,646,369 A | * | 7/1997 | Misha et al. | 174/35 GC |
| 5,712,449 A | | 1/1998 | Miska et al. | 174/35 GC |

* cited by examiner

*Primary Examiner*—Jayprakash N. Gandhi
(74) *Attorney, Agent, or Firm*—Testa, Hurwitz & Thibeault, LLP

(57) ABSTRACT

A substantially planar, laminated electromagnetic interference shield for use around I/O ports in electronic equipment enclosures such as computer cabinets and other electronics includes a resilient foam core, a metallized fabric or cover laminated to the core, and a stiffener bonded to at least one of the core and the fabric. The shield may be manufactured on a process line which laminates and bonds the elements together, die cuts the I/O port apertures, and prints identifying indicia on the shield.

16 Claims, 4 Drawing Sheets

I/O PORT EMI SHIELD

RELATED APPLICATIONS

This application claims priority to and the benefit of International Application PCT/US99/06389, filed Mar. 23, 1999 (published in English under PCT Article 21(2) on Sep. 30, 1999 as WO 99/49712) and U.S. Provisional Application Serial No. 60/079,030, filed Mar. 23, 1998.

TECHNICAL FIELD

The present invention relates to electromagnetic interference ("EMI") shields and, more specifically, to an EMI shield manufactured from a foam core laminated by a metallized fabric or other electrically conductive material or covering.

BACKGROUND

During normal operation, electronic equipment generates undesirable electromagnetic energy that can interfere with the operation of proximately located electronic equipment due to EMI transmission by radiation and conduction. The electromagnetic energy can by of a wide range of wavelengths and frequencies. To minimize the problems associated with EMI, sources of undesirable electromagnetic energy may be shielded and electrically grounded. Shielding is designed to prevent both ingress and egress of electromagnetic energy relative to a housing or other enclosure in which the electronic equipment is disposed. Since such enclosures often include gaps or seams between adjacent access panels and around doors and connectors, effective shielding is difficult to attain because the gaps in the enclosure permit transference of EMI therethrough. Further, in the case of electrically conductive metal enclosures, these gaps can inhibit the beneficial Faraday Cage Effect by forming discontinuities in the conductivity of the enclosure which compromise the efficiency of the ground conduction path through the enclosure. Moreover, by presenting an electrical conductivity level at the gaps that is significantly different from that of the enclosure generally, the gaps can act as slot antennae, resulting in the enclosure itself becoming a secondary source of EMI.

An area of concern in electronic enclosures such as personal computers and the like, which connect to peripheral equipment, is the zone surrounding electrical connectors and electrical connections, generally referred to as an input/output ("I/O") panel. Cutouts and other access are provided in a bezel in the enclosure to facilitate connection of cabling which connect a computer processor to a printer, a display, a keyboard, and other related equipment. The connector sockets are typically mounted on an I/O panel back plane of a printed circuit board. As with other gaps in the enclosure, these cutouts are preferably shielded with an EMI shield.

Specialized EMI shields have been developed for use in gaps and around doors to provide a degree of EMI shielding while permitting operation of enclosure doors and access panels and fitting of connectors. To shield EMI effectively, the shield should be capable of absorbing or reflecting EMI as well as establishing a continuous electrically conductive path across the gap in which the shield is disposed. Conventional metallic shields manufactured from copper doped with beryllium are widely employed for EMI shielding due to their high level of electrical conductivity. Due to inherent electrical resistance in the shield, a portion of the electromagnetic field being shielded induces a current in the shield, requiring that the shield form a part of an electrically conductive path for passing the induced current flow to ground. Failure to ground the shield adequately could result in radiation of an electromagnetic field from a side of the shield opposite the primary EMI field.

In addition to the desirable qualities of high conductivity and grounding capability, EMI shields should be elastically compliant and resilient to compensate for variable gap widths and door operation, yet tough to withstand repeated door closure and connector installation without failing due to metal fatigue. EMI shields should also be configured to ensure intimate electrical contact with proximate structure while presenting minimal force resistance to door closure and connector installation. It is also desirable that the shield be resistant to galvanic corrosion which can occur when dissimilar metals are in contact with each other for extended periods of time. Low cost, ease of manufacture, and ease of installation are also desirable characteristics for achieving broad use and commercial success.

Conventional metallic EMI shields, often referred to as copper beryllium finger strips, include a plurality of cantilevered or bridged fingers that provide spring and wiping actions when compressed. Other types of EMI shields include closed-cell foam sponges having metallic wire mesh knitted thereover or metallized fabric bonded thereto. Metallic wire mesh may also be knitted over silicone tubing. Strips of rolled metallic wire mesh, without foam or tubing inserts, are also employed.

One problem with metallic finger strips is that to ensure a sufficient compression force, the copper finger strips are made from thin stock, for example on the order of about 0.05 mm (0.002 inches) to about 0.15 mm (0.006 inches) in thickness Accordingly, sizing of the finger strip uninstalled height and the width of the gap in which it is installed must be controlled to ensure adequate electrical contact when installed and compressed, yet prevent plastic deformation and resultant failure of the strip due to overcompression of the fingers. To enhance toughness, beryllium is added to the copper to form an alloy; however, the beryllium adds cost. Finger strips are also expensive to manufacture, in part due to the costs associated with procuring and developing tooling for outfitting presses and rolling machines to form the complex contours required. Changes to the design of a finger strip to address production or performance problems require the purchase of new tooling and typically incur development costs associated with establishing a reliable, high yield manufacturing process.

Metallic mesh and mesh covered foam shields avoid many of the installation disadvantages of finger strips; however, they can be relatively costly to produce due to the manufacturing controls required to realize acceptable production yields. Further, due to manufacturing tolerances and the number of apertures or slots required for the connectors on an I/O panel, adequate shielding cannot always be ensured due to unshielded gaps.

SUMMARY OF THE INVENTION

An I/O port EMI shield according to the invention overcomes many of the limitations and disadvantages of conventional EMI shields. In one embodiment, a foam core is laminated by and bonded to an electrically conductive covering, such as a metallized fabric. A generally planar stiffener is then bonded to at least one of the core and the fabric. The stiffener may have an aperture formed in the stiffener prior to bonding with the core and/or fabric. Thereafter, one or more apertures may be formed in the shield, for example by a die cutting operation, to accurately size and locate desired connector openings in the shield. A silk screen or other printing operation may be used to mark the shield with indicia, such as the type of connector or cable to be employed with a particular port.

In an alternative embodiment, the foam core may be substantially fully wrapped by the metallized fabric or other electrically conductive covering. The stiffener may then be bonded to the fabric, the apertures formed, and the shield printed. In another embodiment, the foam core may be bonded to the stiffener and the assembly fully wrapped by the metallized fabric. The stiffener may have an aperture formed in the stiffener prior to bonding with the core and/or fabric. In any of these embodiments, one or more adhesive strips or spots may be provided to facilitate installation of the shield into the enclosure.

An EMI shield according to the invention combines effective EMI shielding, due to the compressible resilient nature of the foam core, with flexibility of manufacture to accommodate a wide variety of I/O port applications. In one embodiment, the shield may be manufactured by a continuous process, along a manufacturing line. A metallized fabric or other conductive covering in the form of a roll having an adhesive laminated along one side thereof is passed over a heated plate to thermally activate the adhesive. The fabric is then mated with a foam core dispensed from a roll. By initially adhering the foam to the fabric, stretching of the foam core is minimized.

Next, the foam and fabric are mated with the stiffener and passed through a folding die to wrap the fabric around at least opposite edges of the stiffener. In one embodiment, the stiffener may have an adhesive laminated to the side disposed proximate the foam core. In another embodiment, the stiffener may have an aperture formed prior to attaching the foam and fabric. The entire assembly is then pulled through a heated forming die to complete bonding of the fabric to the stiffener and the stiffener to the foam. The shield may then be passed through a rotary die cutter to form the desired apertures in the shield. The shield may also be passed through a silk screen or other printing process to label the apertures and the shield with suitable indicia, as desired. Alternatively, the stiffener could be pre-printed. Also, an adhesive tape or spotting may be applied to a front or rear face of the shield to facilitate installation in the enclosure.

BRIEF DESCRIPTION OF THE DRAWINGS

The invention, in accordance with preferred and exemplary embodiments, together with further advantages thereof, is more particularly described in the following detailed description taken in conjunction with the accompanying drawings in which.

DETAILED DESCRIPTION

Figure 1:
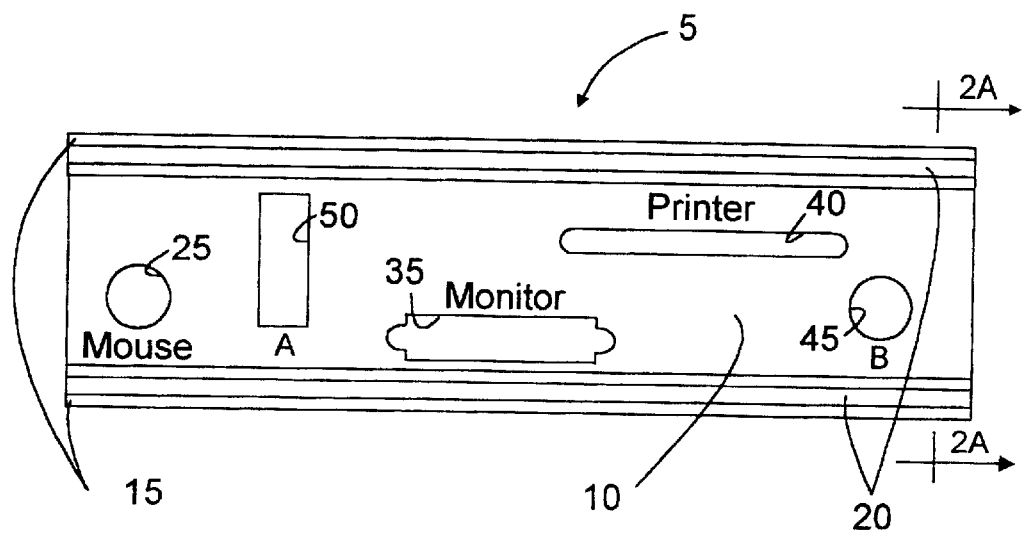
FIG. 1 is a schematic plan view of an EMI shield in accordance with one embodiment of the present invention.

Referring to FIG. 1, shown is a plan view of an I/O port EMI shield 5. When the I/O port EMI shield 5 is constructed in accordance with the teachings of the present invention, the shield 5 can be used for sealing the ingress and egress of EMI transmissions to and from electronic equipment at connector apertures formed therein. The shield 5 is a lamination of a metallized fabric 15, a foam core 30, and a stiffener 10. One or more apertures can be cut in the shield 5 to allow connection of support equipment or peripherals to the electronic equipment, such as a computer mouse connector aperture 25, a computer monitor aperture 35, a computer printer aperture 40, a peripheral "A" aperture 50, and a peripheral "B" aperture 45. In addition, adhesive strips 20 may be attached to the shield 5 to facilitate installation of shield 5 in the electronic equipment.

Figures 2A, 2B, 2C:
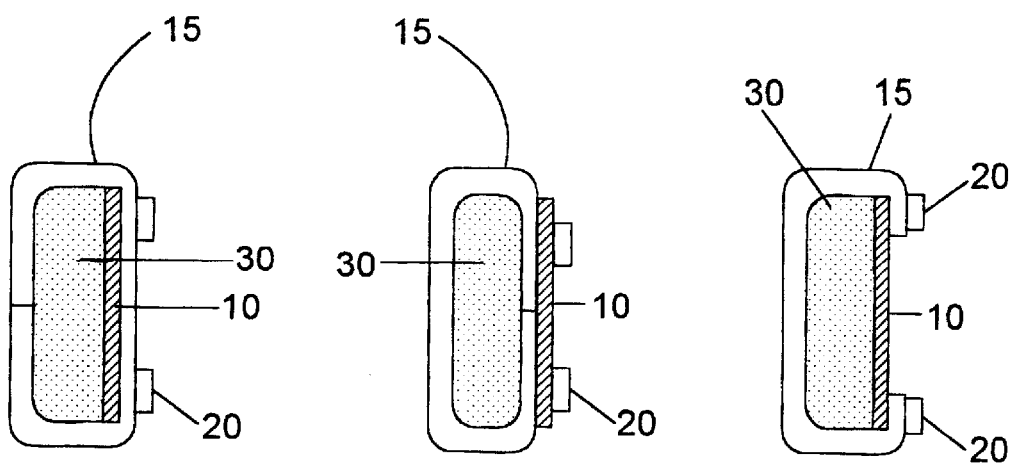
FIG. 2A is a schematic cross-sectional view of the EMI shield depicted in FIG. 1, taken along line 2A—2A, in accordance with one embodiment of the present invention.
FIG. 2B is a schematic cross-sectional view of an EMI shield in accordance with an alternative embodiment of the present invention.
FIG. 2C is a schematic cross-sectional view of an EMI shield in accordance with another embodiment of the present invention.

FIG. 2A shows a cross-sectional view of FIG. 1, which illustrates the construction of the shield 5 according to one embodiment. The relative sizes and thicknesses of the various elements of the shield 5 in this and other figures are merely to facilitate depiction and should not be considered limiting. In this embodiment, the foam core 30 is attached to the stiffener 10. The metallized fabric 15 is wrapped around the foam core 30 and around portions of the stiffener 10 along opposite edges thereof and bonded thereto. Optionally, conductive adhesive strips 20 may be attached to the metallized fabric 15 proximate the stiffener 10 to facilitate installation and form a conductive path between the shield 5 and the equipment enclosure.

Referring to FIG. 2B, shown is a cross-sectional view of another embodiment of the present invention. In FIG. 2B, the foam core 30 is substantially completely surrounded by the metallized fabric 15. The stiffener 10 is then attached to the metallized fabric 15, preferably covering the split line of the fabric 15. Optionally, adhesive strips 20 are then attached to the stiffener 10.

FIG. 2C shows a cross-sectional view of another embodiment of the present invention. In FIG. 2C, the foam core 30 is attached to the stiffener 10. The metallized fabric 15 is then wrapped around both the foam core 30 and the stiffener 10. Optionally, adhesive strips 20 are attached to the metallized fabric 15.

Figure 3:
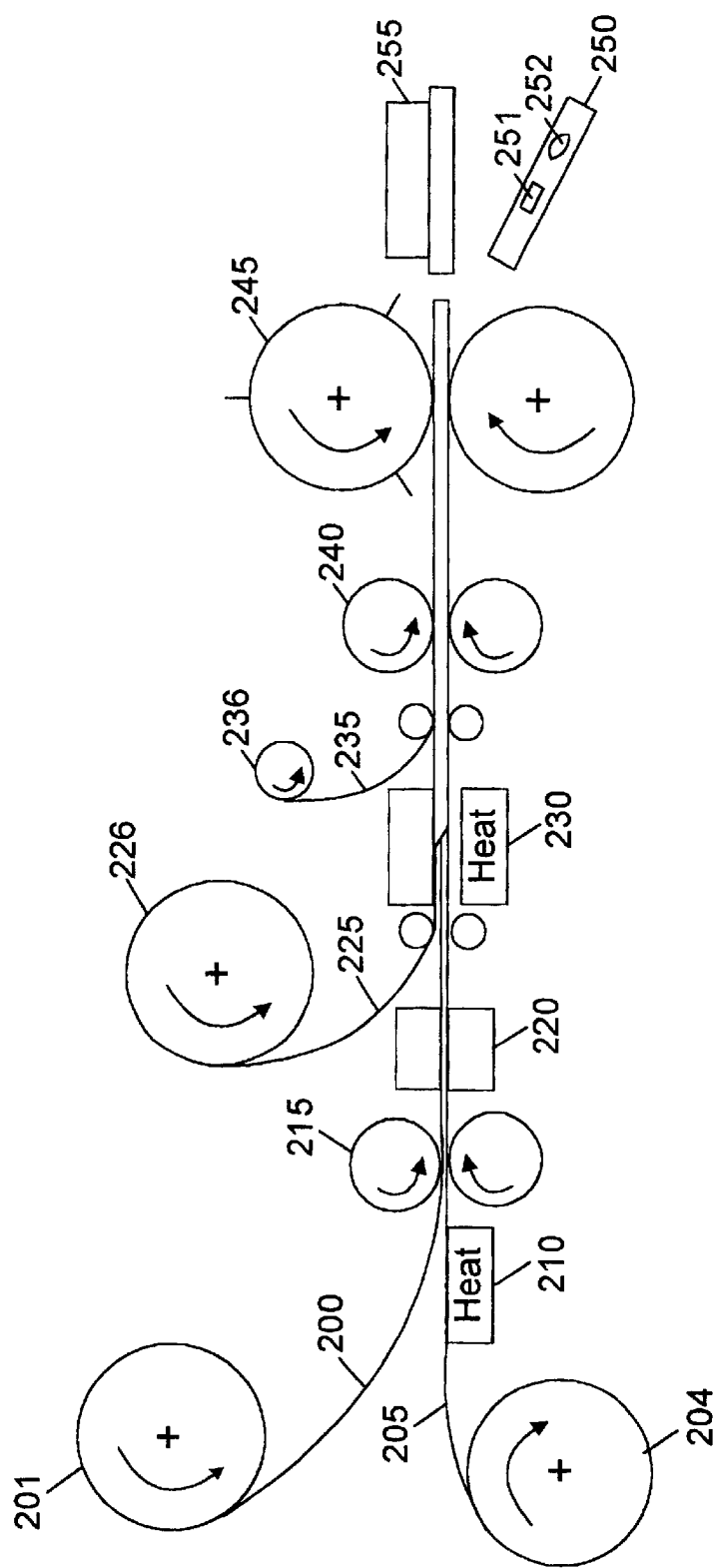
FIG. 3 is a schematic view of a process line for manufacturing an EMI shield in accordance with an embodiment of the present invention.

FIG. 3 is a schematic diagram of one embodiment of a process line for manufacturing an I/O EMI shield. A roll of metallized fabric 204 provides a continuous source of metallized fabric 205 which passes over a heater 210 activate an adhesive backing thereon. The metallized fabric 205 is then passed through a nip formed between a pair of rollers 215, where the metallized fabric 205 is mated with a foam core 200 supplied by a roll of foam 201. The metallized fabric 205 and foam core 200 are then bonded together in a bonding die 220 which may wrap the fabric 205 wholly or partially about the core 200. A roll 226 or other source is used to supply stiffener material 225, which is passed through a folding/bonding die 230, where the stiffener material 225 is bonded to the previously bonded fabric 205 and/or foam core 200. A roll 236 of adhesive strips 235 may be used to feed one or more adhesive strips 235 to a nip formed between a pair of traction rolls 240 where the adhesive strips 235 are bonded to the stiffener 225 or metallized fabric 205 to form the I/O EMI shield 250. A rotary die cutter 245 may be used to form one or more apertures 251, 252 in the EMI shield 250. The I/O EMI shield 250 may be passed through a printer 255 for marking the EMI shield 250 to indicate connector types for the connector apertures 251, 252. The exact order and type of manufacturing process steps may vary, depending on the configuration of EMI shield sought to be produced. For example, the stiffener 225 can be prepunched prior to attaching the metallized fabric 205 and foam core 200, with the fabric 205 and core 200 being cut thereafter to form apertures therein of similar or dissimilar size. Alternatively or additionally, the stiffener 225 can be attached first to the foam core 200, then subsequently be partially or fully wrapped by the fabric 205.

Figure 4:
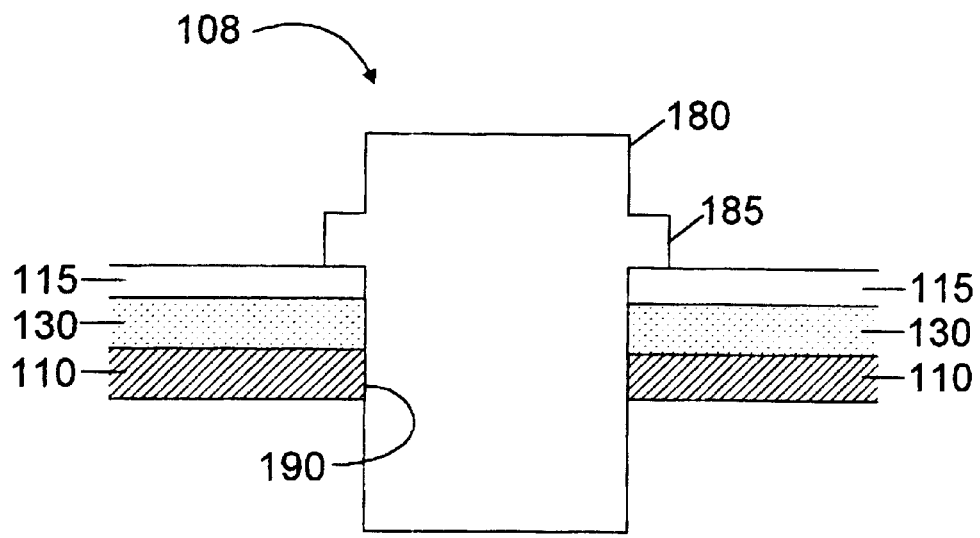
FIG. 4 is a schematic cross-sectional view of an EMI shield in combination with a connector in accordance with an embodiment of the present invention.

FIG. 4 shows an aperture 190 formed in an I/O shield 108 having a connector 180 passing therethrough. The aperture 190, which may be of substantially uniform size, is formed by cutting material from the stiffener 110, the foam core 130, and the metallized fabric 115. The connector 180 can then be passed through the aperture 190, such that a connector flange 185 abuts the metallized fabric 115, compressing the foam core 130, as necessary, to compensate for variability in axial location of the connector 180 and to provide a conductive electrical path between an outer ground shield of the connector 180 and the I/O shield 108.

Figure 5:
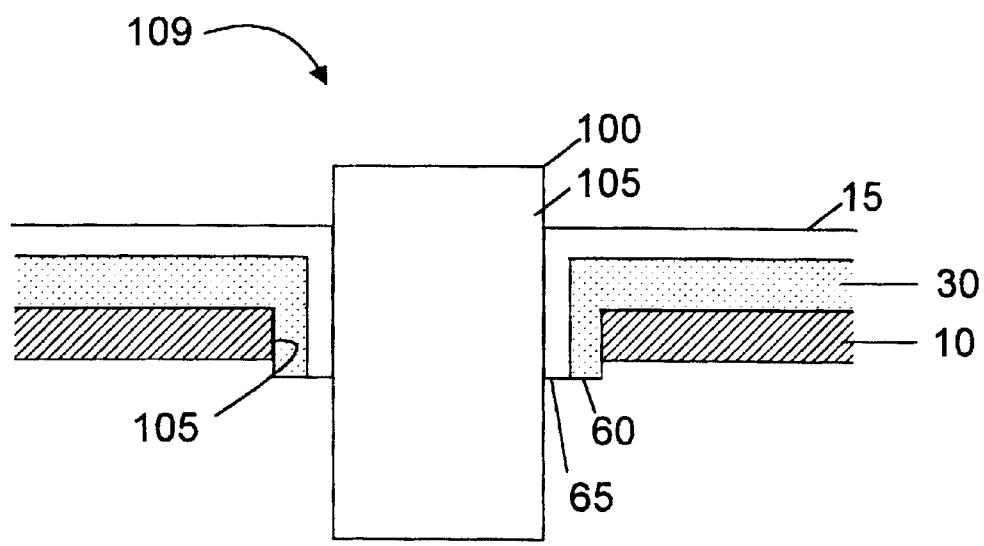
FIG. 5 is a schematic cross-sectional view of an EMI shield in accordance with another embodiment of,he present invention.

Referring now to FIG. 5, shown is another embodiment of an I/O EMI shield 109 having a connector 100 passing therethrough. In this embodiment, the stiffener 10 may be prepunched to form a stiffener aperture 105 having a first size. An aperture formed in the foam core 30 and the fabric 15 may be cut to a different size. For example, in the embodiment depicted, the aperture formed in the foam core 30 and fabric 15 is smaller than the aperture 105 formed in the stiffener 10, such that a portion 60 of the foam 30 and a portion 65 of the fabric 15 covers at least a portion of the aperture 105 formed in the stiffener 10. The unsupported overlapping foam 60 and fabric 65 may be configured to deform into the aperture 105 formed in the stiffener 10 to provide improved EMI shielding along a perimeter of the connector 100 once the connector 100 is inserted therethrough.

Figure 6:
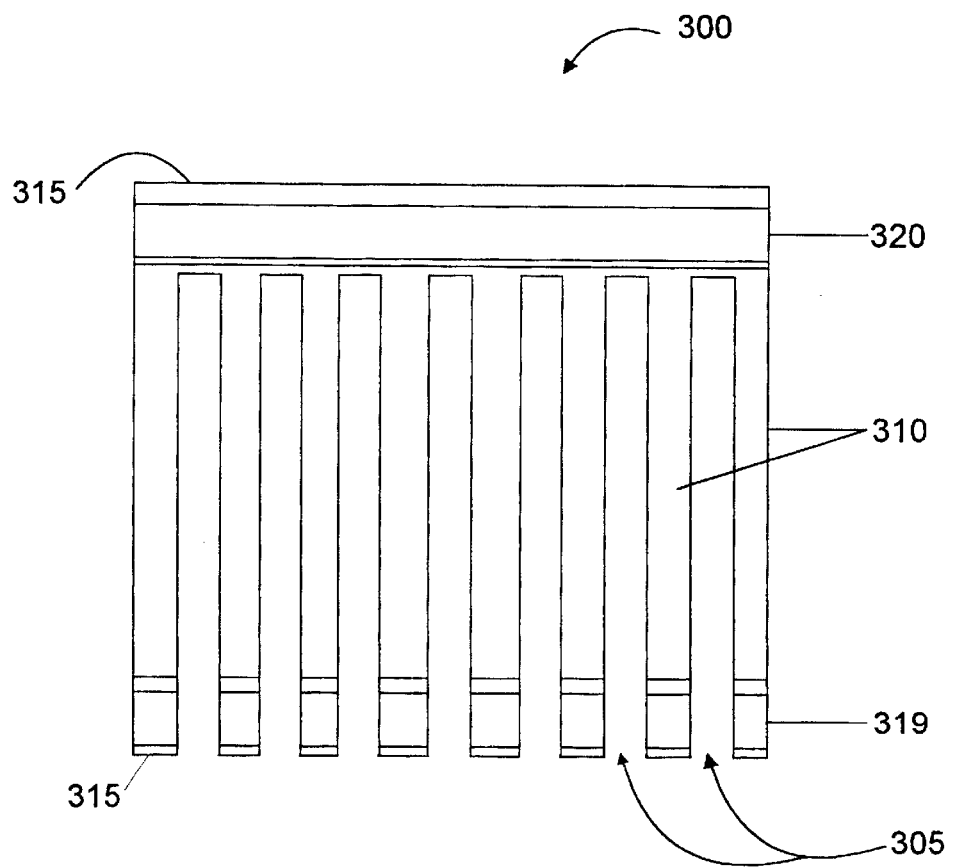
FIG. 6 is a schematic plan view of an EMI shield in accordance with yet still another embodiment of the present invention.

FIG. 6, shows a plan view of an I/O port EMI shield 300 for use with I/O cards such as those typically used in a computer. In this embodiment, the shield 300 is configured to form a plurality of adjacent I/O board slots 305 or apertures to accept a common number of I/O cards. The shield 300 includes a foam core, stiffener 310, metallized fabric 315, adhesive tape 320, and adhesive spots 319. The shield 300 may be manufactured according to any of the cross-sectional configurations discussed hereinabove, and variants thereof.

As used herein, the term aperture is meant to cover all sizes and shapes of holes, gaps, slits, openings, and other penetrations through the layers of the laminated EMI shields, including open ended slots, such as those depicted in FIG. 6.

In general, according to the invention, the core is a fire retardant urethane foam, although other resiliently compressible cores may be used. For example, the core may be manufactured from other types of urethanes, thermally formable foams, or thermoplastic elastomer foams. Silicones, gels, natural or synthetic rubbers, and gas filled bladders may also be employed.

As used herein, the term electrically conductive covering is meant to cover all manner of electrically conductive structure capable of at least partially surrounding a stiffener or foam core, including metallized fabrics, foils, conductive polymers, flexible conductive ceramics, and the like. The term metallized fabrics includes articles having one or more metal coatings disposed on woven, nonwoven, or open mesh carrier backings and equivalents thereof See, for example, U.S. Pat. No. 4,900,618 issued to O'Connor et al., U.S. Pat. No. 4,901,072 issued to Morgan et al., U.S. Pat. No. 5,075,037 issued to Morgan et al., U.S. Pat. No. 5,082,734 issued to Vaughn, and U.S. Pat. No. 5,393,928 issued to Cribb et al., the disclosures of which are herein incorporated by reference. Metallized fabrics are commercially available in a variety of metal and fabric carrier backing combinations. For example, copper on a nylon carrier, nickel-copper alloy on a nylon carrier, and nickel on a polyester mesh carrier are available under the registered trademark Flectron® from Advanced Performance Materials located in St. Louis, Mo. An aluminum foil on a polyester mesh carrier is available from Neptco, located in Pawtucket, R.I. Other suitable metals include silver, tin, zinc, palladium, gold, and platinum. Electrically conductive paints could also be used, as well as metallic vapor depositions. The choice of metal is guided, in part, by installation conditions of the EMI shield. For example, a particular metal might be chosen due to the composition of abutting body metal in the enclosure to avoid galvanic corrosion of the EMI shield which could increase electrical resistance and deteriorate electrical grounding performance.

Metallized tapes are desirable both for ease of application to the foam core as well as durability. One method of manufacture employs the metallized fabric in tape form of suitable width backed with a thermally activated glue. The glue may cover substantially the entire backing or solely portions thereof, such as along the edges.

Any of a variety of stiffener materials may be utilized, including sheet metals, moderate to high durometer natural or synthetic rubbers, polymers such as polytetrafluoroethylene and polyvinyl chloride, and thermoplastic elastomers. In one embodiment, the stiffener is a polymer such as Lexan® resin, available from General Electric Company, Pittsfield, Mass. A relatively thin layer, such as 0.4 mm (0.017 inches) in thickness may be employed to provide structural integrity to the EMI shield. One function of the stiffener is to maintain dimensional stability of the EMI shield during both forming of the I/O port apertures and installation of the shield in the electronic enclosure. Another function of the stiffener is to provide a tough resilient support which guards against penetration of the electronic enclosure by a screwdriver or other tool during installation of electrical connectors to the I/O ports as well as the fingers of a user or technician. The stiffener also provides a smooth, flat surface on which indicia can be printed, labels may be bonded, or in which other markings may be embossed.

In one embodiment, the EMI shield exhibits a resistivity of less than about 0.2 ohms/cm$^2$ to about 5 ohms/cm$^2$, or more. The thickness of the EMI shield may be between about 2.0 mm (0.080 inches) or less and about 3.2 mm (0.125 inches) or more. Length and width may be any suitable dimension, for example from about 38 mm (1.5 inches) or less to about 160 mm (6.25 inches) or more. The metallized fabric may have a thickness between about 0.1 mm (0.004 inches) or less and about 0.5 mm (0.02 inches) or more. The metallized fabric may overlap opposite edges of the stiffener from between about 2.5 mm (0.10 inches) or less to about 6.4 mm (0.25 inches) or more. These ranges are considered exemplary in nature and specific dimensions for a particular application would depend on the mechanical properties of the foam core, the overall configuration of the EMI shield, the location tolerance of the connectors, and the electrical properties of the metallized fabric. Accordingly, values outside these ranges are considered to be within the scope of the invention. Further, the fabric may include one or more drain wires passing therethrough, for example, in a criss-cross pattern, to further facilitate grounding.

Manufacturing laminated I/O port EMI shields in accordance with FIG. 2A on an in-line process utilizes less metallized fabric than fully laminated designs, resulting in cost savings. Tight manufacturing tolerances and superior product appearance may also be maintained. Due to the compliant resilience of the foam core in combination with the structural rigidity of the stiffener, the EMI shield is easier and safer to install than metal shields, affords improved electrical grounding to the enclosure, and provides superior shielding effectiveness by conforming readily to variable width gaps and connector locations.

While there have been described herein what are to be considered exemplary and preferred embodiments of the present invention, other modifications of the invention will become apparent to those skilled in the art from the teachings herein. The particular methods of manufacture of and geometries disclosed herein are exemplary in nature and are not to be considered limiting.

For example, an extrudable polymer stiffener may be formed in situ on the fabric or foam core as the shield is produced. In another embodiment, all four edges of the shield can be wrapped by the fabric. In yet another embodiment, the thickness of the foam or other core material may vary as a function of location, so that the shield is thicker in one region than another to accommodate gaps of different thickness in the enclosure and connector locations. As will be readily appreciated, the EMI shield can be used effectively with elements other than connectors, such as cables and the like, when size and spatial location at installation can vary.

It is therefore desired to be secured in the appended claims all such modifications as fall within the spirit and scope of the invention. Accordingly, what is desired to be secured by Letters Patent is the invention as defined and differentiated in the following claims.

What is claimed is:

1. An EMI gasket comprising:
   a foam core;
   an electrically conductive covering surrounding at least a portion of the foam core; and
   a substantially rigid stiffener for providing structural integrity to the EMI gasket, the stiffener attached to at least one of the foam core and the covering, wherein an aperture is formed in the stiffener, the foam core, and the covering for receiving an element therethrough.

2. The EMI gasket of claim 1 wherein the electrically conductive covering comprises a metallized fabric.

3. The EMI gasket of claim 2 wherein at least one of the foam core and the metallized fabric covers a portion of the aperture formed in the stiffener.

4. The EMI gasket of claim 2 wherein at least one of the stiffener and the metallized fabric is marked with indicia to indicate an element type.

5. The EMI gasket of claim 2 further comprising an adhesive adhered to at least one of the stiffener and the metallized fabric.

6. The EMI gasket of claim 1 wherein the element is a connector.

7. The EMI gasket of claim 1 wherein the element is a cable.

8. A method of making an EMI gasket, the method comprising the steps of:
   providing a foam core, an electrically conductive covering, and a substantially rigid stiffener;
   wrapping at least a portion of the foam core with the covering;
   attaching the stiffener to at least one of the foam core and the covering; and
   forming an aperture in the stiffener, the foam core, and the covering for receiving an element therethrough.

9. The method of claim 8 wherein the electrically conductive covering comprises a metallized fabric.

10. The method of claim 9 wherein at least one of the foam core and the metallized fabric covers a portion of the aperture formed in the stiffener.

11. The method of claim 9 wherein the wrapping step further comprises bonding the foam core to the metallized fabric.

12. The method of claim 9 wherein the attaching step further comprises bonding the stiffener to at least one of the foam core and the metallized fabric.

13. The method of claim 8 further comprising the step of marking the EMI gasket to indicate element type.

14. The method of claim 8 wherein the element is a connector.

15. The method of claim 8 wherein the element is a cable.

16. An article produced in accordance with the method of claim 8.

* * * * *